(12) United States Patent
Takasawa et al.

(10) Patent No.: US 12,121,926 B2
(45) Date of Patent: Oct. 22, 2024

(54) FLUID SUPPLY SYSTEM

(71) Applicant: FUJIKIN INCORPORATED, Osaka (JP)

(72) Inventors: Ryohei Takasawa, Osaka (JP); Naoto Tagashira, Osaka (JP); Teruyuki Funabiki, Osaka (JP); Masanori Uebayashi, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 473 days.

(21) Appl. No.: 17/638,376

(22) PCT Filed: Jun. 24, 2020

(86) PCT No.: PCT/JP2020/024738
§ 371 (c)(1),
(2) Date: Feb. 25, 2022

(87) PCT Pub. No.: WO2021/039073
PCT Pub. Date: Mar. 4, 2021

(65) Prior Publication Data
US 2022/0323979 A1 Oct. 13, 2022

(30) Foreign Application Priority Data
Aug. 29, 2019 (JP) ................. 2019-156355

(51) Int. Cl.
*B05C 11/10* (2006.01)
*B05C 9/02* (2006.01)

(52) U.S. Cl.
CPC ............... *B05C 11/10* (2013.01); *B05C 9/02* (2013.01); *Y10T 137/6966* (2015.04); *Y10T 137/7032* (2015.04)

(58) Field of Classification Search
CPC ......... Y10T 137/6966; Y10T 137/7032; Y10T 137/7039; Y10T 137/2931; B05C 11/10;
(Continued)

(56) References Cited

U.S. PATENT DOCUMENTS 6,105,606 A * 8/2000 Jackson ............... B08B 15/023
141/93
6,440,504 B1 * 8/2002 Akiyama ............ C23C 16/4409
118/723 R
(Continued)

FOREIGN PATENT DOCUMENTS

| CN | 104011839 A | 8/2014 |
|----|-------------|--------|
| JP | 2016211021 A | 12/2016 |

(Continued)

*Primary Examiner* — Jessica Cahill
(74) *Attorney, Agent, or Firm* — Li & Cai Intellectual Property (USA) Office (57) ABSTRACT

A fluid supply system includes: a support body having: a base plate; a side plate provided on one side of the base plate in the longitudinal direction so as to be orthogonal to the base plate; and a top plate provided on one end of the base plate in the height direction so as to be orthogonal to the base plate and the side plate; a process-gas supply unit provided on an outer surface of the top plate; a liquid supply unit provided on an inner surface of the side plate so as to communicate with the process-gas supply unit via a communication-flow-channel forming block; and a purge-gas supply unit provided on an inner surface of base plate so as to communicate with the process-gas supply unit via a communication pipe.

7 Claims, 7 Drawing Sheets

(58) Field of Classification Search
CPC ..... B05C 9/02; B05C 15/00; C23C 16/45561; H01L 21/67017
See application file for complete search history.

(56) References Cited

U.S. PATENT DOCUMENTS

| | | | | |
|---|---|---|---|---|
| 6,648,020 | B2* | 11/2003 | Fujimoto | F16K 27/003 |
| | | | | 137/884 |
| 9,157,578 | B2* | 10/2015 | Hayashi | F17C 9/02 |
| 9,180,232 | B2* | 11/2015 | Williams | A61M 1/77 |
| 10,118,263 | B2* | 11/2018 | Kellogg | B23P 19/12 |
| 11,088,002 | B2* | 8/2021 | Pierreux | C23C 16/482 |
| 2003/0101938 | A1* | 6/2003 | Ronsse | C23C 16/4401 |
| | | | | 118/712 |
| 2006/0147633 | A1* | 7/2006 | Jones | B05C 5/00 |
| | | | | 427/421.1 |
| 2006/0175943 | A1* | 8/2006 | Paradis | A47B 47/0066 |
| | | | | 312/223.1 |
| 2008/0066859 | A1* | 3/2008 | Kobayashi | F04D 27/0269 |
| | | | | 156/345.1 |
| 2011/0111136 | A1* | 5/2011 | Slevin | C23C 16/45561 |
| | | | | 118/723 R |
| 2012/0241023 | A1* | 9/2012 | Ikeda | F16K 1/34 |
| | | | | 137/487 |

FOREIGN PATENT DOCUMENTS

| | | |
|---|---|---|
| KR | 19990079279 A | 11/1999 |
| WO | WO 2011041389 A | 5/2011 |

* cited by examiner

FLUID SUPPLY SYSTEM

FIELD OF THE DISCLOSURE

The present invention relates to a fluid supply system.

BACKGROUND OF THE DISCLOSURE

JP2016-211021A discloses a process-gas supply unit that supplies a process gas generated by vaporizing liquid to a supply target.

SUMMARY OF THE DISCLOSURE

In a fluid supply system, it is generally considered to arrange the process-gas supply unit disclosed by JP2016-211021A, a liquid supply unit that supplies the liquid to the process-gas supply unit, and a purge-gas supply unit that supplies a purge gas to the process-gas supply unit in the same plane. However, in this case, it is required to ensure a space for arranging the process-gas supply unit, the liquid supply unit, and the purge-gas supply unit in the same plane, and therefore, there is a problem in that a size reduction of the fluid supply system cannot be achieved as a whole.

The present invention has been conceived in light of the above described circumstances, and an object thereof is to provide a fluid supply system the size of which can be reduced.

According to an aspect of the present invention, provided is a fluid supply system including: a support body having: a first plate; a second plate provided on one side of the first plate in a longitudinal direction so as to be orthogonal to the first plate; and a third plate provided on one end of the first plate in a height direction so as to be orthogonal to the first plate and the second plate; a first-gas supply unit provided on the third plate, the first-gas supply unit being configured to vaporize liquid and being configured to supply a first gas generated by the vaporization of the liquid to a supply target; a liquid supply unit provided on either one of the first plate and the second plate, the liquid supply unit being configured to supply the liquid to the first-gas supply unit; a second-gas supply unit provided on other of the first plate and the second plate, a second-gas supply unit being configured to supply a second gas to the first-gas supply unit; a first communication mechanism configured to enable communication between the first-gas supply unit and the liquid supply unit; and a second communication mechanism configured to enable communication between the first-gas supply unit and the second-gas supply unit.

According to the aspect of the present invention, it is possible to achieve the size reduction of the fluid supply system as a whole.

DETAILED DESCRIPTION OF THE EXEMPLARY EMBODIMENTS

In the following, an embodiment of the present invention (hereinafter, referred to as "this embodiment") will be described below with reference to the attached drawings. In this description, the same reference signs are given to the same components throughout the description. In the figures, the longitudinal direction, the width direction, and the height direction of a fluid supply system 1 correspond to the direction extending along the X axis, the direction extending along the Y axis, and the direction extending along the Z axis, respectively. In the following, for the sake of convenience of description, the longitudinal direction, the width direction, and the height direction of the fluid supply system 1 are simply referred to as the longitudinal direction, the width direction, and the height direction, respectively. The directions designated as above may not correspond to the directions at the time of installation.

Figure 1:
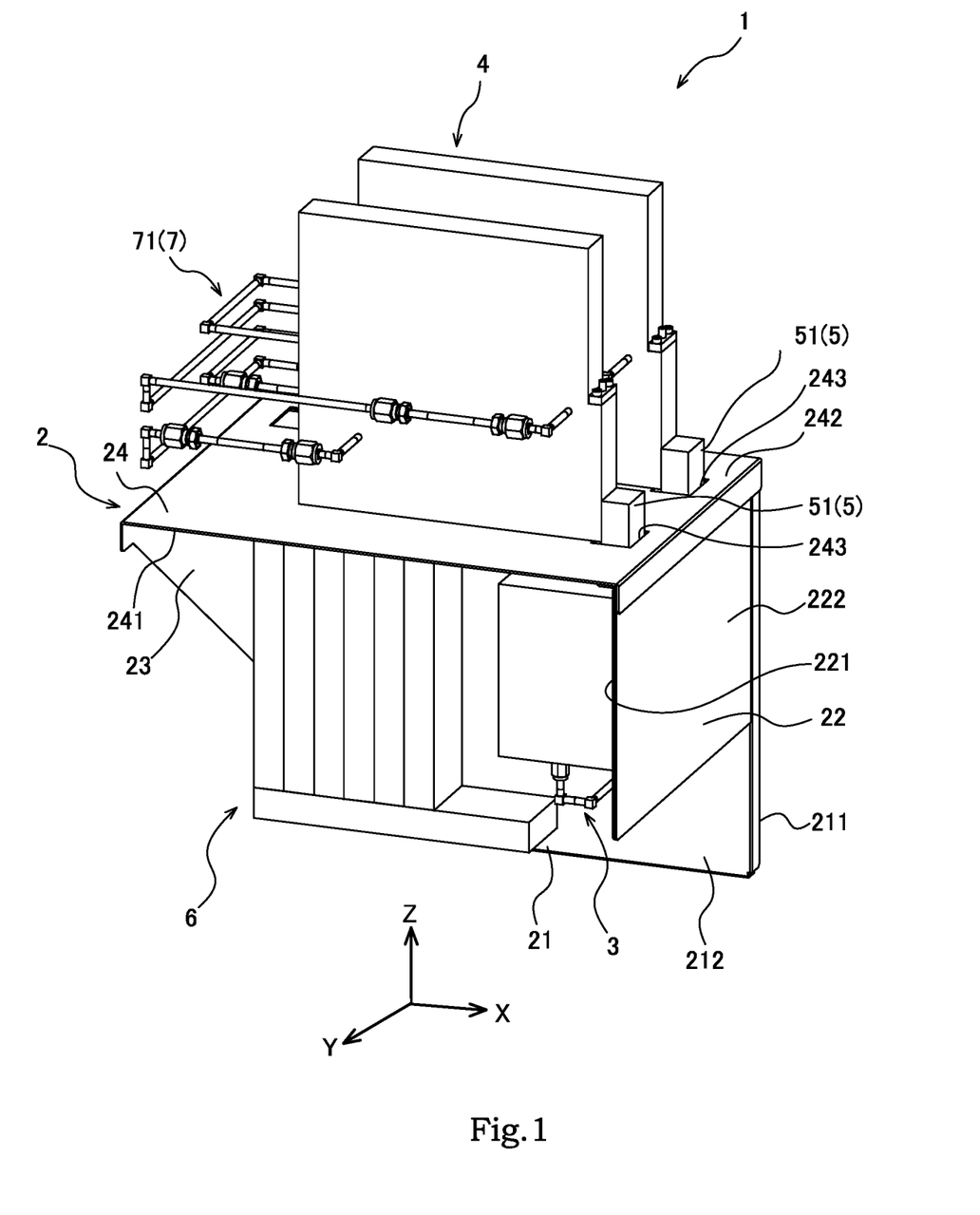
FIG. 1 is a perspective view showing a fluid supply system according to an embodiment of the present invention.
Figure 2:
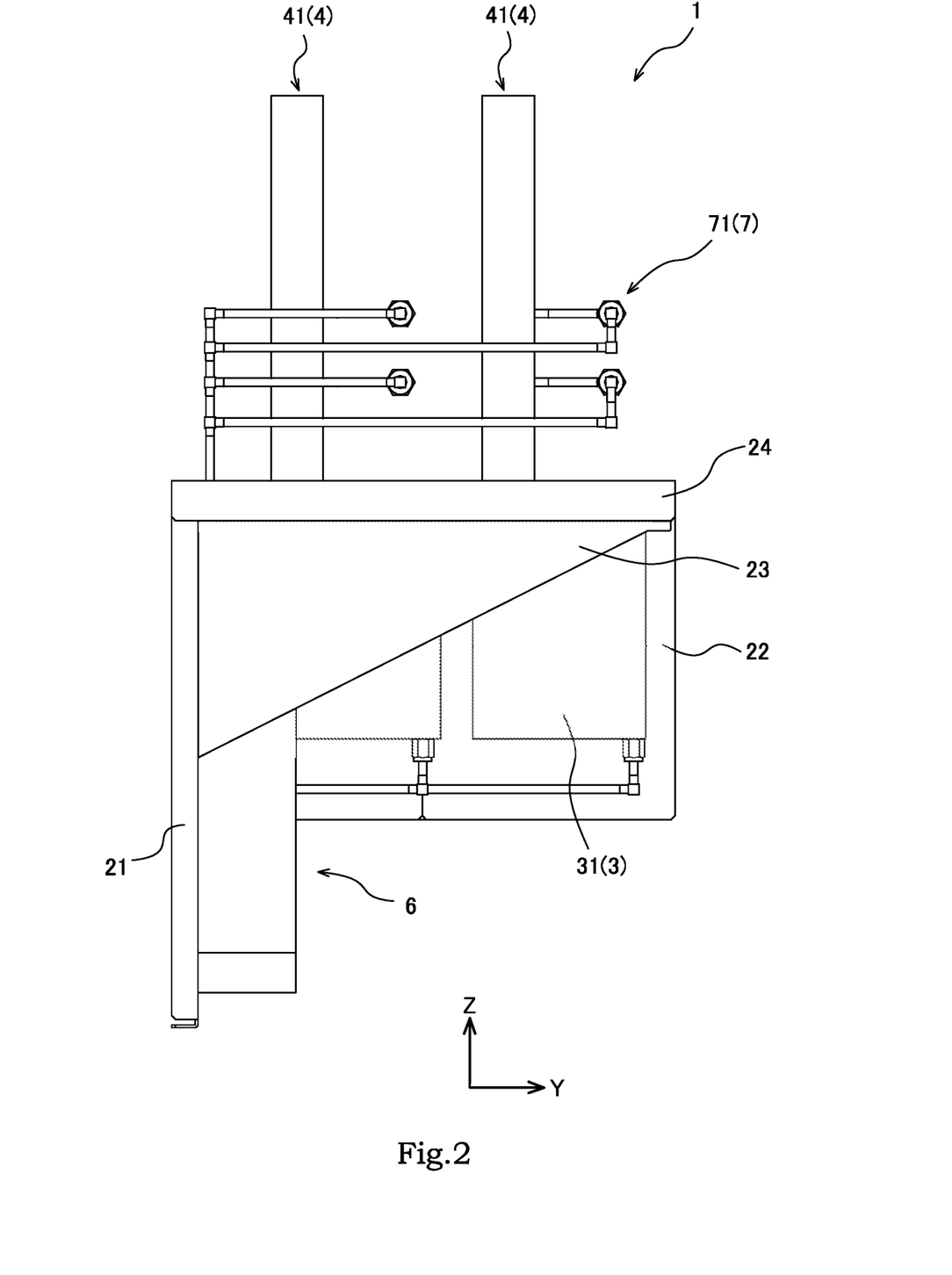
FIG. 2 is a left side view showing the fluid supply system.
Figure 3:
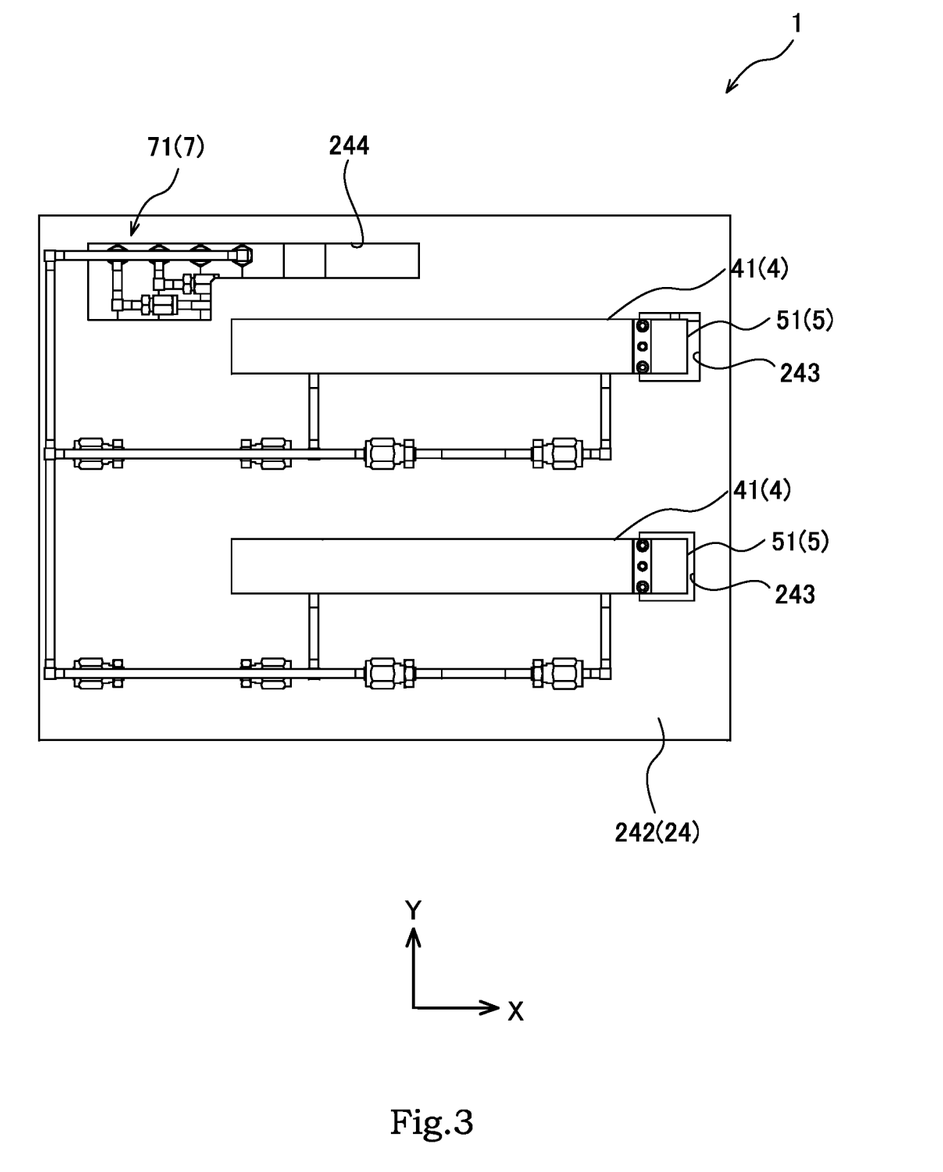
FIG. 3 is a top view showing the fluid supply system.
Figure 4:
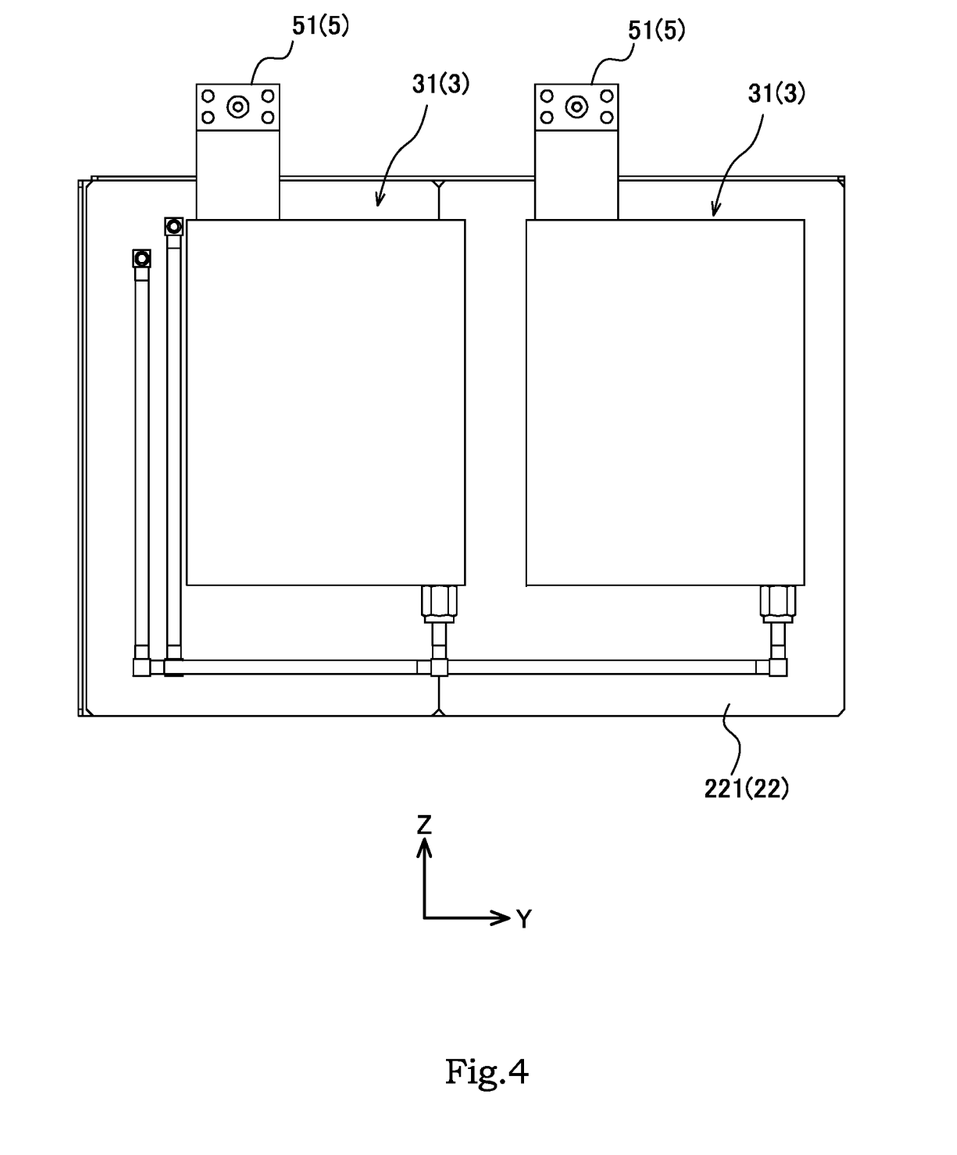
FIG. 4 is an explanatory diagram showing a liquid supply unit and a side plate on which the liquid supply unit is provided.
Figure 5:
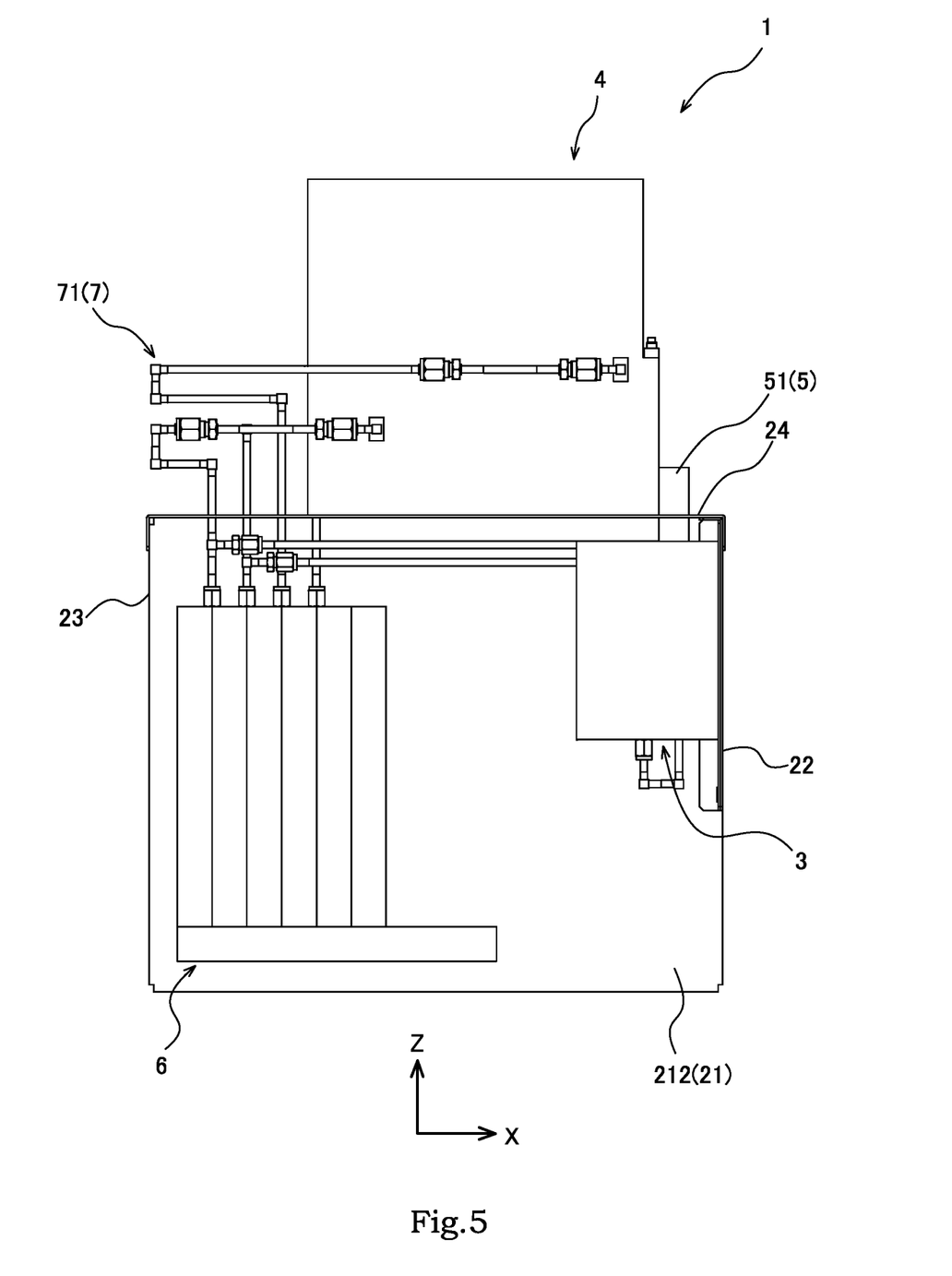
FIG. 5 is a front view showing the fluid supply system.
Figure 6:
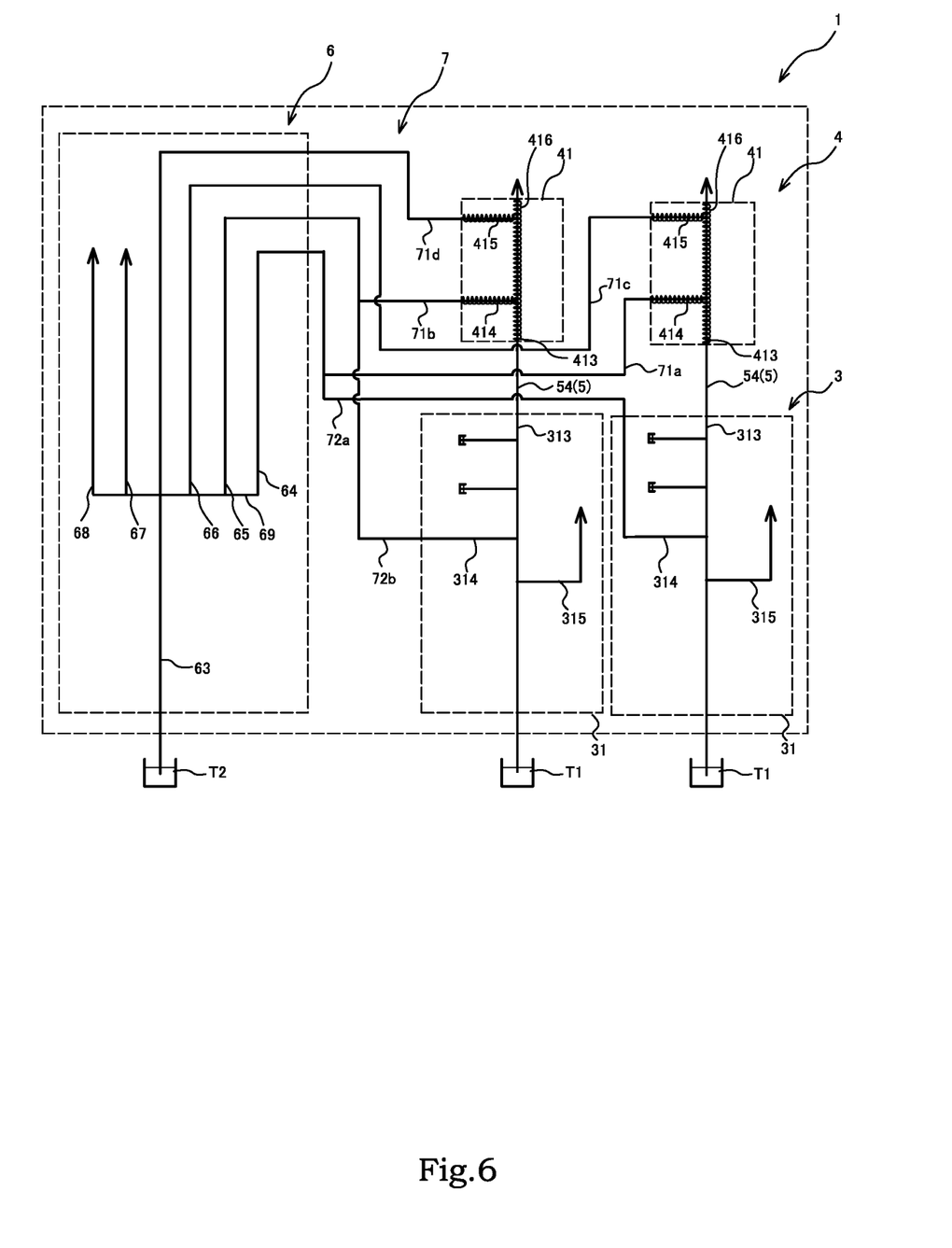
FIG. 6 is a circuit diagram of the fluid supply system.
Figure 7:
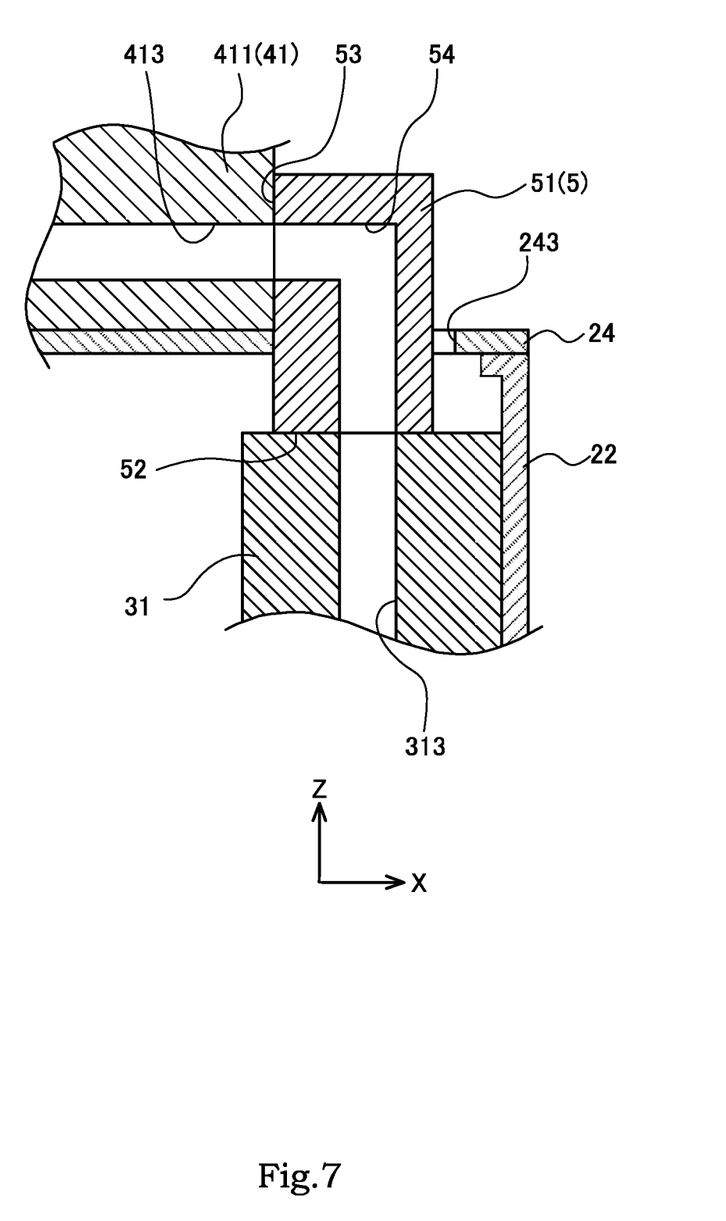
FIG. 7 is a sectional view schematically showing a vicinity of a communication-flow-channel forming block.

FIG. 1 is a perspective view showing the fluid supply system 1. FIG. 2 is a left side view showing the fluid supply system 1. FIG. 3 is a top view showing the fluid supply system 1. FIG. 4 is an explanatory diagram showing a liquid supply unit and a side plate on which the liquid supply unit is provided. FIG. 5 is a front view showing the fluid supply system 1. FIG. 6 is a circuit diagram showing the fluid supply system 1. FIG. 7 is a sectional view schematically showing a vicinity of a communication-flow-channel forming block 51.

The fluid supply system 1 according to this embodiment is used for a supply means of a process gas serving as a first gas and a purge gas serving as a second gas in a semiconductor manufacturing equipment (a CVD equipment, a sputtering equipment, an etching equipment, and so forth).

As shown in FIGS. 1 to 5, the fluid supply system 1 is provided with a support body 2, a liquid supply unit 3, a process-gas supply unit 4 serving as a first-gas supply unit, a first communication mechanism 5, a purge-gas supply unit 6 serving as a second-gas supply unit, and a second communication mechanism 7.

The support body 2 is a support member made of a metal material (for example, made of steel) on which the liquid supply unit 3, the process-gas supply unit 4, and the purge-gas supply unit 6 are provided. The support body 2 has a base plate 21 serving as a first plate, a side plate 22 serving as a second plate, an auxiliary plate 23, and a top plate 24 serving as a third plate.

The base plate 21 is a rectangular sheet metal serving as an attachment part that is attached to a wall portion (not shown) by using screws, etc., for example. The base plate 21 is formed on a first plane that extends along both of the X axis and the Z axis. In addition, the base plate 21 has an outer surface 211 serving as an attachment surface to which the wall portion comes into contact and an inner surface 212 that is the surface on the reverse side of the outer surface 211. On the inner surface 212 of the base plate 21, the purge-gas supply unit 6 is provided by using screws, etc., for example.

As described above, because the purge-gas supply unit 6 is provided on the inner surface 212 of the base plate 21 that is attached to the wall portion (in other words, a position easily accessible by a user), the user can perform their work, etc. for the purge-gas supply unit 6 with ease.

The side plate 22 is a rectangular sheet metal that is provided on the one side of the base plate 21 in the longitudinal direction (the right side in FIG. 1) by using screws, for example. The side plate 22 is formed on a second plane that extends along both of the Y axis and the Z axis so as to be orthogonal to the base plate 21. In addition, the side plate 22 has an inner surface 221 serving as an opposing surface opposing to the auxiliary plate 23 and an outer surface 222 that is the surface on the reverse side of the inner surface 221. The liquid supply unit 3 is provided on the inner surface 221 of the side plate 22 by using screws, etc., for example.

As shown in FIG. 2, the auxiliary plate 23 is a sheet metal having a right-angled triangle shape that is provided on the other side of the base plate 21 in the longitudinal direction (the left side in FIG. 1) by using screws, for example. The auxiliary plate 23 is formed on a fourth plane that extends along both of the Y axis and the Z axis and that is in parallel with the second plane so as to be orthogonal to the base plate 21. In addition, the auxiliary plate 23 is a sheet metal for increasing a rigidity of the support body 2 as a whole.

The top plate 24 is a rectangular sheet metal that is provided on the one end of the base plate 21 in the height direction (the upper end in FIG. 1) by using screws, for example. The top plate 24 is formed on a third plane that extends along both of the X axis and the Y axis so as to be orthogonal to the base plate 21 and the side plate 22 (the auxiliary plate 23). In addition, the top plate 24 has an inner surface 241 serving as an opposing surface opposing to the liquid supply unit 3 and the purge-gas supply unit 6 and an outer surface 242 that is the surface on the reverse side of the inner surface 241. The process-gas supply unit 4 is provided on the outer surface 242 of the top plate 24 by using screws, etc., for example.

As shown in FIG. 3, the top plate 24 is formed with a plurality of rectangular first through holes 243 (two holes in this case) each serving as a first opening through which each of a plurality of communication-flow-channel forming blocks 51, which will be described later, can penetrate. Specifically, the plurality of first through holes 243 are formed on the one end side of the top plate 24 in the longitudinal direction (the right side in FIG. 1) so as to be arranged at a predetermined interval in the width direction. The number of the first through holes 243 is the same as the same as the number of liquid supply parts 31 forming the liquid supply unit 3. In other words, the number of the first through holes 243 corresponds to the number of the liquid supply parts 31.

In addition, the top plate 24 is formed with a single rectangular second through hole 244 serving as a second opening through which a plurality of communication pipes 71 (four pipes in this case; see FIG. 6), which will be described later, can penetrate. Specifically, the single second through hole 244 is formed on the other side of the top plate 24 in the longitudinal direction (the left side in FIG. 1) so as to extend in the longitudinal direction of the top plate 24.

The one end of the top plate 24 in the longitudinal direction (the right side in FIG. 1) is joined with the one end of the side plate 22 (the upper end in FIG. 1), and the other end of the top plate 24 in the longitudinal direction (the left side in FIG. 1) is joined with the auxiliary plate 23. With such a configuration, the top plate 24 and the process-gas supply unit 4 provided on the top plate 24 are supported by the base plate 21, the side plate 22, and the auxiliary plate 23. Therefore, because there is no need to separately provide members for supporting the top plate 24 and the process-gas supply unit 4, it is possible to achieve simplification of the fluid supply system 1 as a whole.

As described above, by respectively providing the liquid supply unit 3, the process-gas supply unit 4, and the purge-gas supply unit 6 on the side plate 22, the top plate 24, and the base plate 21 of the support body 2, it is possible to achieve the three-dimensional configuration of the fluid supply system 1. Therefore, compared with a case in which the liquid supply unit 3, the process-gas supply unit 4, and the purge-gas supply unit 6 are provided on the same plane, it is possible to achieve the size reduction of the fluid supply system 1 as a whole.

As shown in FIGS. 1 and 4, the liquid supply unit 3 is a unit that supplies fluid containing the liquid supplied from a liquid tank T1 serving as a liquid supply source (see FIG. 6) to the process-gas supply unit 4 via the first communication mechanism 5. From the view point of switching of a plurality of kinds of liquids and purging, the liquid supply unit 3 has the plurality of the liquid supply parts 31 (two parts in this case) and liquid discharge parts. The plurality of liquid supply parts 31 are provided so as to be arranged at a predetermined interval in the width direction.

The liquid supply parts 31 are provided on the inner surface 221 of the side plate 22 of the support body 2 so as to extend in the height direction. The liquid supply parts 31 each has a first flow-channel forming block inside of which flow channels are formed and a first fluid apparatus that is provided above the first flow-channel forming block. The first fluid apparatus includes, for example, an automatic valve, a manual valve, and so forth. A heater for increasing temperature may be attached to the liquid supply parts 31.

In addition, as shown in FIG. 6, the liquid supply parts 31 each has: a liquid supply line 313 serving as a first flow channel; a purge line 314; and a branch line 315 that are respectively formed of the flow channels in the first flow-channel forming block. The liquid supply line 313 is provided with a manual valve, an automatic valve, or the like.

The purge line 314 is branched from a fluid supply line 64 (65) and is connected to the liquid supply line 313 via a branch pipe 72a (72b). The purge line 314 is provided with a manual valve, an automatic valve, or the like.

The branch line 315 is a line for a waste. In addition, the branch line 315 is branched from the liquid supply line 313 and is connected to an external communication pipe (not shown). The branch line 315 is provided with a manual valve, an automatic valve, or the like.

As shown in FIGS. 1 and 3, the process-gas supply unit 4 is a unit that vaporizes the liquid supplied from the liquid supply unit 3, controls flows of the process gas generated by vaporizing the liquid, and supplies the process gas the flow of which is controlled to a chamber (not shown) as a supply target. The process-gas supply unit 4 is formed of a plurality of process-gas supply parts 41 (in this case, two parts). The plurality of process-gas supply parts 41 are provided so as to be arranged at a predetermined interval in the width direction. The number of the process-gas supply parts 41 forming the process-gas supply unit 4 is the same as the number of the liquid supply parts 31 forming the liquid supply unit 3. In other words, the number of the process-gas supply parts 41 corresponds to the number of the liquid supply parts 31.

The process-gas supply parts 41 are provided on the outer surface 242 of the top plate 24 of the support body 2 so as to extend in the longitudinal direction. The process-gas supply parts 41 each has a second flow-channel forming block inside of which the flow channels are formed and a second fluid apparatus that is provided above the second flow-channel forming block. The second fluid apparatus includes, for example, an automatic valve, a flow rate controller, and so forth.

In addition, as shown in FIG. 6, the process-gas supply parts 41 each has: a fluid supply line 413 serving as a second flow channel; a purge line 414; a purge line 415; and a heater 416 that heats the whole process-gas supply parts 41 that are respectively formed of the flow channels in the second flow-channel forming block. The fluid supply line 413 is provided with an automatic valve, a flow rate controller, or the like.

The purge line 414 is branched from the fluid supply line 64 (65) and is connected to the fluid supply line 413 via a communication pipe 71a (71b). The purge line 414 is provided with an automatic valve, etc.

The purge line 415 communicates with a fluid supply line 66 (63) and is connected to the fluid supply line 413 via a communication pipe 71c (71d), which will be described later. The purge line 415 is provided with an automatic valve, etc.

The process-gas supply part 41 vaporizes the liquid supplied from the liquid supply unit 3 by the heat from the heater 416 in a part of the fluid supply line 413. Thereafter, the process-gas supply part 41 supplies the process gas the flow rate of which is controlled to the chamber via a communication pipe (not shown).

As shown in FIGS. 1, 3, and 6, the first communication mechanism 5 is a mechanism that enables communication between the liquid supply unit 3 and the process-gas supply unit 4. The first communication mechanism 5 is formed of the plurality of communication-flow-channel forming blocks 51 (in this case, two blocks). The number of the communication-flow-channel forming blocks 51 forming the first communication mechanism 5 is the same as the number of the first through holes 243 in the top plate 24. In other words, the number of the communication-flow-channel forming blocks 51 corresponds to the number of the first through holes 243. The plurality of communication-flow-channel forming blocks 51 are provided so as to be arranged at a predetermined interval in the width direction.

The communication-flow-channel forming blocks 51 are each a cuboid block through which one end of the liquid supply part 31 forming the liquid supply unit 3 (the upper end in FIG. 1) is communicated with one end of the process-gas supply part 41 forming the process-gas supply unit 4 (the right side in FIG. 1). In addition, the communication-flow-channel forming blocks 51 are provided so as to extend in the height direction so as to respectively penetrate through the first through holes 243 in the top plate 24. In other words, the communication-flow-channel forming blocks 51 are provided so as to be respectively received in the first through holes 243.

As described above, because the liquid supply parts 31 and the process-gas supply parts 41 are communicated through the communication-flow-channel forming blocks 51 that are provided so as to respectively penetrate through the first through holes 243, it is possible to provide the liquid supply parts 31 on the inner surface 221 of the side plate 22 and to provide the process-gas supply parts 41 on the outer surface 242 of the top plate 24. Therefore, compared with the fluid supply system in which the liquid supply parts 31 and the process-gas supply parts 41 are provided on the outer surface 222 of the side plate 22 and the outer surface 242 of the top plate 24, respectively, it is possible to achieve the size reduction of the fluid supply system 1 as a whole.

Furthermore, because the one ends of the liquid supply parts 31 and the one ends of the process-gas supply parts 41 are respectively connected through the communication-flow-channel forming blocks 51, the respective connections between the one ends of the liquid supply parts 31 and the one ends of the process-gas supply parts 41 can be achieved by providing the communication-flow-channel forming blocks 51 with ease. In addition, it is possible to provide the one ends of the liquid supply parts 31 and the one ends of the process-gas supply parts 41 so as to approach with each other by providing the communication-flow-channel forming blocks 51 extending in the height direction.

As shown in FIG. 5, the liquid supply unit 3 is provided such that at least a part thereof overlaps with the process-gas supply unit 4 in the longitudinal direction when viewed from the top side (the height direction). With such a configuration, compared with the fluid supply system in which the liquid supply unit 3 is provided so as not to overlap with the process-gas supply unit 4 in the longitudinal direction, it is possible to reduce the size of the fluid supply system 1 in the longitudinal direction. Therefore, it is possible to achieve the size reduction of the fluid supply system 1 as a whole.

The one ends of the liquid supply parts 31 (specifically, the first flow-channel forming block) are not penetrating through the first through holes 243 in the top plate 24. With such a configuration, because it suffices to cause each of the first through holes 243 to have a size that is large enough to allow only the communication-flow-channel forming block 51 to penetrate therethrough, the first through holes 243 need not be formed to have a large size, and so, it is possible to suppress deterioration of strength of the top plate 24 due to formation of the excessively large first through holes 243.

As shown in FIG. 7, the communication-flow-channel forming block 51 is connected to the one end (the upper end) of the liquid supply part 31 (specifically, the first flow-channel forming block) and the one end (the right end) of the process-gas supply part 41 (specifically, the second flow-channel forming block) by using screws, for example. In the communication-flow-channel forming block 51, a lower end surface 52 thereof comes into contact with the one end of the liquid supply part 31 and a left end surface 53 thereof comes into contact with the one end of the process-gas supply part 41.

A communication flow channel 54 having an L-shape when viewed in cross-section is formed within the communication-flow-channel forming block 51. The one end and the other end of the L-shaped communication flow channel 54 open at the lower end surface 52 and the left end surface 53 of the communication-flow-channel forming block 51, respectively.

As shown in FIGS. 6 and 7, one end of the liquid supply line 313 on the downstream side that is formed within the first flow-channel forming block is communicated with one end of the fluid supply line 413 on the upstream side that is formed within the second flow-channel forming block by the L-shaped communication flow channel 54 that is formed within the cuboid communication-flow-channel forming block 51. With such a configuration, compared with a communication-flow-channel forming block having an L-shape, the communication flow channel 54 can be made shorter, and therefore, it is possible to supply the liquid from the liquid supply line 313 of the liquid supply part 31 to the fluid supply line 413 of the process-gas supply part 41 via the L-shaped communication flow channel 54 rapidly.

In order to prevent a leakage of the liquid through a gap formed at a joint between the first flow-channel forming block or the second flow-channel forming block and the lower end surface 52 or the left end surface 53 of the communication-flow-channel forming block 51, it is preferable that a seal member (for example, a resin O-ring) be provided at each of the lower end surface 52 and the left end surface 53 so as to surround both ends of the L-shaped communication flow channel 54.

As shown in FIGS. 5 and 6, the purge-gas supply unit 6 is a unit that controls flow of the purge gas supplied from a purge gas tank T2 serving as a purge gas source and that supplies the purge gas the flow of which is controlled to the liquid supply unit 3 and the process-gas supply unit 4. The purge gas is an inert gas (for example, nitrogen gas).

The purge-gas supply unit 6 is provided on the inner surface 212 of the base plate 21 of the support body 2 so as to extend in the height direction. The purge-gas supply unit 6 has a third flow-channel forming block inside of which the flow channels are formed and a third fluid apparatus that is provided above the third flow-channel forming block. The third fluid apparatus includes, for example, a manual valve, an automatic valve, a massflow controller, a check valve, a pressure gage, and so forth.

As shown in FIG. 5, the purge-gas supply unit 6 is provided such that at least a part thereof overlaps with the process-gas supply unit 4 in the longitudinal direction when viewed from the top side (the height direction). With such a configuration, compared with the fluid supply system in which the purge-gas supply unit 6 is provided so as not to overlap with the process-gas supply unit 4 in the longitudinal direction, it is possible to reduce the size of the fluid supply system 1 in the longitudinal direction. Therefore, it is possible to achieve the size reduction of the fluid supply system 1 as a whole.

In addition, as shown in FIG. 6, the purge-gas supply unit 6 has the fluid supply lines 63, 64, 65, 66, 67, and 68 and a diverting flow channel 69 formed of the flow channels in the third flow-channel forming block. The fluid supply line 63 is provided with a manual valve, a pressure gage, an automatic valve, a massflow controller (or a massflow meter, other flow meter), a check valve, and so forth. In this case, because the heat in the process-gas supply unit 4 is removed in accordance with the flow rate of the purge gas, a massflow controller is provided to perform a precise temperature control.

The fluid supply line 63 is communicated with one ends of the fluid supply lines 64, 65, 66, 67, and 68 on the upstream side by the diverting flow channel 69. A part of the purge gas flowing through the fluid supply line 63 can be diverted to the fluid supply lines 64, 65, 66, 67, and 68 by the diverting flow channel 69.

The fluid supply line 64 is provided with a massflow controller, a manual valvar, an automatic valve, a check valve, and so forth. The fluid supply line 65 is provided with a massflow controller, a manual valve, an automatic valve, a check valve, and so forth. The fluid supply line 66 is provided with a massflow controller, an automatic valve, a check valve, and so forth.

The fluid supply line 67 is provided with a massflow controller, an automatic valve, and so forth. The fluid supply line 68 is provided with a massflow controller, an automatic valve, and so forth. The fluid supply lines 67 and 68 are connected to an external communication pipe (not shown).

As shown in FIGS. 1, 3, and 6, the second communication mechanism 7 is a mechanism that enables communication between the process-gas supply unit 4 and the purge-gas supply unit 6 and that enables communication between the liquid supply unit 3 and the purge-gas supply unit 6. The second communication mechanism 7 has the plurality of communication pipes 71 (71a, 71b, 71c, and 71d) (in this case, four pipes) and a plurality of branch pipes 72 (72a and 72b) (in this case, two pipes).

The communication pipes 71 (71a, 71b, 71c, and 71d) are each a pipe through which one end of the purge-gas supply unit 6 (the upper end in FIG. 1) is communicated with the process-gas supply part 41 forming the process-gas supply unit 4. In addition, the communication pipes 71 (71a, 71b, 71c, and 71d) are provided so as to penetrate through the second through hole 244 in the top plate 24. In other words, the communication pipes 71 (71a, 71b, 71c, and 71d) are provided so as to be received in the second through hole 244. With such a configuration, the communication between the purge-gas supply unit 6 and the process-gas supply parts 41 is easily realized by the communication pipes 71 that are provided so as to penetrate through the second through hole 244.

As shown in FIG. 6, one end of the fluid supply line 64 on the downstream side is communicated with one end of the purge line 414 in the one of the process-gas supply parts 41 by the communication pipe 71a. One end of the fluid supply line 65 on the downstream side is communicated with one end of the purge line 414 in the other of the process-gas supply parts 41 by the communication pipe 71b. One end of the fluid supply line 66 on the downstream side is communicated with one end of the purge line 415 in the one of the process-gas supply parts 41 by the communication pipe 71c. One end of the fluid supply line 63 on the downstream side is communicated with one end of the purge line 415 in the other of the process-gas supply parts 41 by the communication pipe 71d.

With such a configuration, the purge gas is supplied from the purge-gas supply unit 6 to the process-gas supply parts 41 through the communication pipes 71 (71a, 71b, 71c, and 71d), and thereby, it is possible to purge the inside of the process-gas supply parts 41.

The branch pipe 72a and the branch pipe 72b are branched from the communication pipe 71a and the communication pipe 71b, respectively, and respectively enables, together with the communication pipe 71a and the communication pipe 71b, the communication between the liquid supply parts 31 forming the liquid supply unit 3 and the purge-gas supply unit 6. Specifically, the branch pipe 72a communicates with the purge line 314 in the one of the liquid supply parts 31, and the branch pipe 72b communicates with the purge line 314 in the other of the liquid supply parts 31. The branch pipes 72a and 72b are not penetrating through the second through hole 244.

With such a configuration, the purge gas is supplied from the purge-gas supply unit 6 to the liquid supply parts 31 through the communication pipes 71 (71a, 71b) and the branch pipes 72 (72a and 72b), and so, it is possible to purge the inside of the liquid supply parts 31.

Next, operational advantages according to this embodiment will be described.

The fluid supply system 1 according to this embodiment includes: the support body 2 having: the base plate 21; the side plate 22 provided on the one side of the base plate 21 in the longitudinal direction so as to be orthogonal to the base plate 21; and the top plate 24 provided on the one end of the base plate 21 in the height direction so as to be orthogonal to the base plate 21 and the side plate 22; the process-gas supply unit 4 provided on the top plate 24, the process-gas supply unit 4 being configured to vaporize the liquid and being configured to supply the process gas generated by the vaporization of the liquid to the chamber; the liquid supply unit 3 provided on the side plate 22, the liquid supply unit 3 being configured to supply the fluid containing the liquid to the process-gas supply unit 4; the purge-gas supply unit 6 provided on the base plate 21, the purge-gas supply unit 6 being configured to supply the purge gas to the process-gas supply unit 4; the first communication mechanism 5 configured to enable the communication between the process-gas supply unit 4 and the liquid supply unit 3; and the second communication mechanism 7 configured to enable the communication between the process-gas supply unit 4 and the purge-gas supply unit 6.

With such a configuration, by respectively providing the liquid supply unit 3, the process-gas supply unit 4, and the purge-gas supply unit 6 on the side plate 22, the top plate 24, and the base plate 21 of the support body 2, it is possible to achieve the three-dimensional configuration. Therefore, compared with a case in which the liquid supply unit 3, the process-gas supply unit 4, and the purge-gas supply unit 6 are provided on the same plane, it is possible to achieve the size reduction of the fluid supply system 1 as a whole. In addition, because the respective units (the liquid supply unit 3, the process-gas supply unit 4, and the purge-gas supply unit 6) are respectively provided on different plates, it is possible to achieve the size reduction of the base plate 21, the side plate 22, and the top plate 24 themselves.

Furthermore, because the liquid supply unit 3, the process-gas supply unit 4, and the purge-gas supply unit 6 are respectively provided on the side plate 22, the top plate 24, and the base plate 21 of the support body 2, it is possible to suppress influence of vibration caused by other devices to the fluid supply system 1.

In addition, in this embodiment, the process-gas supply unit 4 is provided on the outer surface 242 of the top plate 24, the liquid supply unit 3 is provided on the inner surface 221 of the side plate 22, the top plate 24 is formed with the first through hole 243, and the first communication mechanism 5 has the communication-flow-channel forming block 51, the communication-flow-channel forming block 51 being provided so as to be received in the first through hole 243.

With such a configuration, because the liquid supply unit 3 is communicated with the process-gas supply unit 4 by the communication-flow-channel forming block 51 that is provided so as to penetrate through the first through hole 243, it is possible to provide the liquid supply unit 3 on the inner surface 221 of the side plate 22 and to provide the process-gas supply unit 4 on the outer surface 242 of the top plate 24. Therefore, compared with the fluid supply system in which the liquid supply part 31 and the process-gas supply part 41 are provided on the outer surface 222 of the side plate 22 and the outer surface 242 of the top plate 24, respectively, it is further possible to achieve the size reduction of the fluid supply system 1 as a whole.

In addition, in this embodiment, the process-gas supply unit 4 is provided so as to extend in the longitudinal direction, the liquid supply unit 3 is provided so as to extend in the height direction, the communication-flow-channel forming block 51 is a cuboid provided so as to extend in the height direction, and the one end of the liquid supply unit 3 is connected to the one end of the process-gas supply unit 4 by the communication-flow-channel forming block 51.

With such a configuration, the connection between the one end of the liquid supply unit 3 and the one end of the process-gas supply unit 4 is achieved with ease by provision of the communication-flow-channel forming block 51. In addition, it is possible to provide the one end of the liquid supply unit 3 and the one end of the process-gas supply unit 4 so as to approach with each other by providing the communication-flow-channel forming block 51 extending in the height direction.

In addition, in this embodiment, the communication-flow-channel forming block 51 is formed with the L-shaped communication flow channel 54, the liquid supply unit 3 and the process-gas supply unit 4 are formed with the liquid supply line 313 and the fluid supply line 413, respectively, and the liquid supply line 313 is communicated with the fluid supply line 413 by the L-shaped communication flow channel 54.

With such a configuration, the one end of the liquid supply line 313, which is formed within the first flow-channel forming block, on the downstream side is communicated with the one end of the fluid supply line 413, which is formed within the second flow-channel forming block, on the upstream side by the L-shaped communication flow channel 54 formed within the cuboid communication-flow-channel forming block 51. With such a configuration, compared with the L-shaped communication-flow-channel forming block, the communication flow channel 54 can be made shorter, and therefore, it is possible to rapidly supply the liquid from the liquid supply line 313 in the liquid supply part 31 to the fluid supply line 413 in the process-gas supply part 41 via the L-shaped communication flow channel 54.

In addition, in this embodiment, the top plate 24 is formed with the second through hole 244, and the second communication mechanism 7 has the communication pipe 71 provided so as to be received in the second through hole 244.

With such a configuration, the communication between the process-gas supply unit 4 and the purge-gas supply unit 6 is easily achieved by the communication pipe 71 provided so as to be received in the second through hole 244.

In addition, in this embodiment, the purge-gas supply unit 6 is provided such that at least a part of the purge-gas supply unit 6 overlaps with the process-gas supply unit 4 in the longitudinal direction when viewed from the height direction.

With such a configuration, compared with the fluid supply system in which the purge-gas supply unit 6 is provided so as not to overlap with the process-gas supply unit 4 in the longitudinal direction, it is possible to reduce the size of the fluid supply system 1 in the longitudinal direction. Therefore, it is possible to achieve the size reduction of the fluid supply system 1 as a whole.

In addition, in this embodiment, the top plate 24 is supported by the base plate 21 and the side plate 22.

With such a configuration, because there is no need to separately provide members for supporting the top plate 24 and the process-gas supply unit 4, it is possible to achieve the simplification of the fluid supply system 1 as a whole.

Although the present embodiment has been described in the above, the above-described embodiment merely illustrates a part of application examples of the present invention, and the technical scope of the present invention is not intended to be limited to the specific configurations of the above-described embodiment.

(Modification)

In the above-described embodiment, although the liquid supply unit 3 and the purge-gas supply unit 6 are provided on the inner surface 221 of the side plate 22 and the inner surface 212 of the base plate 21, respectively, the present invention is not limited thereto, and for example, they may be provided on the inner surface 212 of the base plate 21 and the inner surface 221 of the side plate 22, respectively. In other words, the liquid supply unit 3 may be provided on either one of the base plate 21 and the side plate 22, and the purge-gas supply unit 6 may be provided on the other of the base plate 21 and the side plate 22.

In addition, in the above-described embodiment, although the support body 2 has the base plate 21, the side plate 22, the auxiliary plate 23, and the top plate 24, the present invention is not limited thereto, and for example, the support body 2 may not have the auxiliary plate 23 and may have only the base plate 21, the side plate 22, and the top plate 24.

In addition, in the above-described embodiment, although the first through holes 243 in the top plate 24 are formed of a plurality of holes, the present invention is not limited thereto, and for example, the first through hole 243 may be formed of a single hole. In this case, two communication-flow-channel forming blocks 51 penetrate through the single first through hole 243.

In addition, in the above-described embodiment, although the first opening is formed of the first through holes 243 that respectively allow the communication-flow-channel forming blocks 51 to penetrate therethrough, the present invention is not limited thereto, and for example, the first opening may be formed of a first notched portion. In this case, the communication-flow-channel forming block 51 is received in the first notched portion in the top plate 24.

In addition, in the above-described embodiment, although the second opening is formed of the second through hole 244 that allows the plurality of communication pipes 71 to penetrate therethrough, the present invention is not limited thereto, and for example, a second notched portion may be formed. In this case, the plurality of communication pipes 71 are received in the second notched portion in the top plate 24.

In addition, in the above-described embodiment, although the liquid supply unit 3 is formed of the plurality of liquid supply parts 31, the present invention is not limited thereto, and for example, the liquid supply unit 3 may be formed of a single liquid supply part 31. In this case, the process-gas supply unit 4 and the first communication mechanism 5 are formed of a single the process-gas supply part 41 and a single communication-flow-channel forming block 51, respectively. In other words, the number of the liquid supply part 31 corresponds to the number of the process-gas supply part 41 and the number of the communication-flow-channel forming block 51.

The present application claims a priority based on Japanese Patent Application No. 2019-156355 filed on Aug. 29, 2019 in the Japan Patent Office, the entire contents of which are incorporated herein by reference.

The invention claimed is:

1. A fluid supply system comprising:
a support body having: a first plate; a second plate provided on one side of the first plate in a longitudinal direction so as to be orthogonal to the first plate; and a third plate provided on one end of the first plate in a height direction so as to be orthogonal to the first plate and the second plate;
a first-gas supply unit provided on the third plate, the first-gas supply unit being configured to vaporize liquid and being configured to supply a first gas generated by the vaporization of the liquid to a supply target;
a liquid supply unit provided on either one of the first plate and the second plate, the liquid supply unit being configured to supply fluid containing the liquid to the first-gas supply unit;
a second-gas supply unit provided on other of the first plate and the second plate, a second-gas supply unit being configured to supply a second gas to the first-gas supply unit;
a first communication mechanism configured to enable communication between the first-gas supply unit and the liquid supply unit; and
a second communication mechanism configured to enable communication between the first-gas supply unit and the second-gas supply unit.

2. The fluid supply system according to claim 1, wherein
the first-gas supply unit is provided on an outer surface of the third plate,
the liquid supply unit is provided on an inner surface of the second plate,
the third plate is formed with a first opening, and
the first communication mechanism has a communication-flow-channel forming block, the communication-flow-channel forming block being provided so as to be received in the first opening.

3. The fluid supply system according to claim 2, wherein
the first-gas supply unit is provided so as to extend in the longitudinal direction,
the liquid supply unit is provided so as to extend in the height direction,
the communication-flow-channel forming block is a cuboid provided so as to extend in the height direction, and
one end of the liquid supply unit is connected to one end of the first-gas supply unit by the communication-flow-channel forming block.

4. The fluid supply system according to claim 3, wherein
the communication-flow-channel forming block is formed with an L-shaped communication flow channel,
the liquid supply unit and the first-gas supply unit are formed with a first flow channel and a second flow channel, respectively, and
the first flow channel is communicated with the second flow channel by the L-shaped communication flow channel.

5. The fluid supply system according to claim 1, wherein
the third plate is formed with a second opening, and
the second communication mechanism has a communication pipe provided so as to be received in the second opening.

6. The fluid supply system according to claim 1, wherein the second-gas supply unit is provided such that at least a part of the second-gas supply unit overlaps with the first-gas supply unit in the longitudinal direction when viewed from the height direction.

7. The fluid supply system according to claim 1, wherein the third plate is supported by the first plate and the second plate.

* * * * *